(12) United States Patent
Iwai

(10) Patent No.: US 11,367,472 B2
(45) Date of Patent: Jun. 21, 2022

(54) SEMICONDUCTOR STORAGE DEVICE

(71) Applicant: Kioxia Corporation, Tokyo (JP)

(72) Inventor: Makoto Iwai, Chigasaki (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/171,025

(22) Filed: Feb. 9, 2021

(65) Prior Publication Data

US 2022/0084566 A1    Mar. 17, 2022

(30) Foreign Application Priority Data

Sep. 11, 2020    (JP) .............. JP2020-152510

(51) Int. Cl.
     *G11C 7/10*      (2006.01)
     *G11C 7/04*      (2006.01)

(52) U.S. Cl.
     CPC .............. *G11C 7/1063* (2013.01); *G11C 7/04* (2013.01); *G11C 7/106* (2013.01); *G11C 7/109* (2013.01); *G11C 7/1087* (2013.01)

(58) Field of Classification Search
     CPC ......... G11C 7/1063; G11C 7/04; G11C 7/106; G11C 7/1087; G11C 7/109
     See application file for complete search history.

(56) References Cited

U.S. PATENT DOCUMENTS

| | | | |
|---|---|---|---|
| 10,055,352 B2 | 8/2018 | Wei et al. | |
| 10,503,650 B2 | 12/2019 | Wei et al. | |
| 10,553,262 B2* | 2/2020 | Kawano | G11C 7/1096 |
| 10,643,703 B2 | 5/2020 | Inoue et al. | |
| 2009/0024101 A1 | 9/2009 | Yano et al. | |
| 2009/0310408 A1* | 12/2009 | Lee | G11C 16/3431 365/185.03 |
| 2016/0071612 A1* | 3/2016 | Takizawa | G11C 16/3495 365/185.11 |
| 2017/0102893 A1* | 4/2017 | Yoon | G06F 3/0619 |
| 2019/0114218 A1 | 4/2019 | Yun et al. | |
| 2019/0179694 A1 | 6/2019 | Park | |
| 2020/0110707 A1 | 4/2020 | Wei et al. | |

* cited by examiner

*Primary Examiner* — Ajay Ojha
(74) *Attorney, Agent, or Firm* — Oblon, McClelland, Maier & Neustadt, L.L.P.

(57) ABSTRACT

A semiconductor storage device of embodiments is a semiconductor storage device including a memory cell array including a plurality of non-volatile memory cells, a sequencer configured to control a sequence based on read operation of reading data from the memory cell array, and a column decoder, the sequencer controlling the sequence of changing a ready/busy signal from ready to busy after receiving a read command and an address signal, reading data from the memory cell array using a sense amplifier after changing the ready/busy signal to the busy, changing the ready/busy signal from the busy to the ready after storing data in the data latch circuit, receiving a data output command after changing the ready/busy signal to the ready, and, in a case where a first condition occurs, writing log data including the data stored in the data latch circuit in a memory area of the memory cell array.

17 Claims, 15 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2020-152510 filed in Japan on Sep. 11, 2020; the entire contents of which are incorporated herein by reference.

FIELD

Embodiments described herein relate generally to a semiconductor storage device.

BACKGROUND

There is a case where it is difficult to analyze a failure of a semiconductor storage device because data for analyzing the failure cannot be sufficiently obtained.

DETAILED DESCRIPTION

A semiconductor storage device of embodiments includes a memory cell array including a plurality of blocks and configured to be able to store first data; a sequencer configured to control a sequence based on read operation of reading the first data from the memory cell array on the basis of a read command received from a memory controller; and a column decoder including a sense amplifier configured to perform sense operation necessary for reading the first data from the memory cell array, and a data latch circuit configured to store the first data, at least one block among the plurality of blocks includes first and second select transistors, and a plurality of non-volatile memory cells connected in series between the first and second select transistors, and the sequencer controls the sequence of receiving the read command and an address signal, changing a ready/busy signal from ready to busy after receiving the read command and the address signal, reading the first data from the memory cell array using the sense amplifier after changing the ready/busy signal to the busy, storing the first data in the data latch circuit, changing the ready/busy signal from the busy to the ready after storing the first data in the data latch circuit, receiving a data output command after changing the ready/busy signal to the ready, outputting the first data stored in the data latch circuit to the memory controller after receiving the data output command, and, in a case where a first condition occurs, writing log data including the first data stored in the data latch circuit in a memory area of the memory cell array.

Embodiments will be described below with reference to the drawings.

First Embodiment

A memory system according to a first embodiment will be described. A memory system including a NAND flash memory will be described below as an example.

[Entire Configuration of Memory System]

Figure 1:
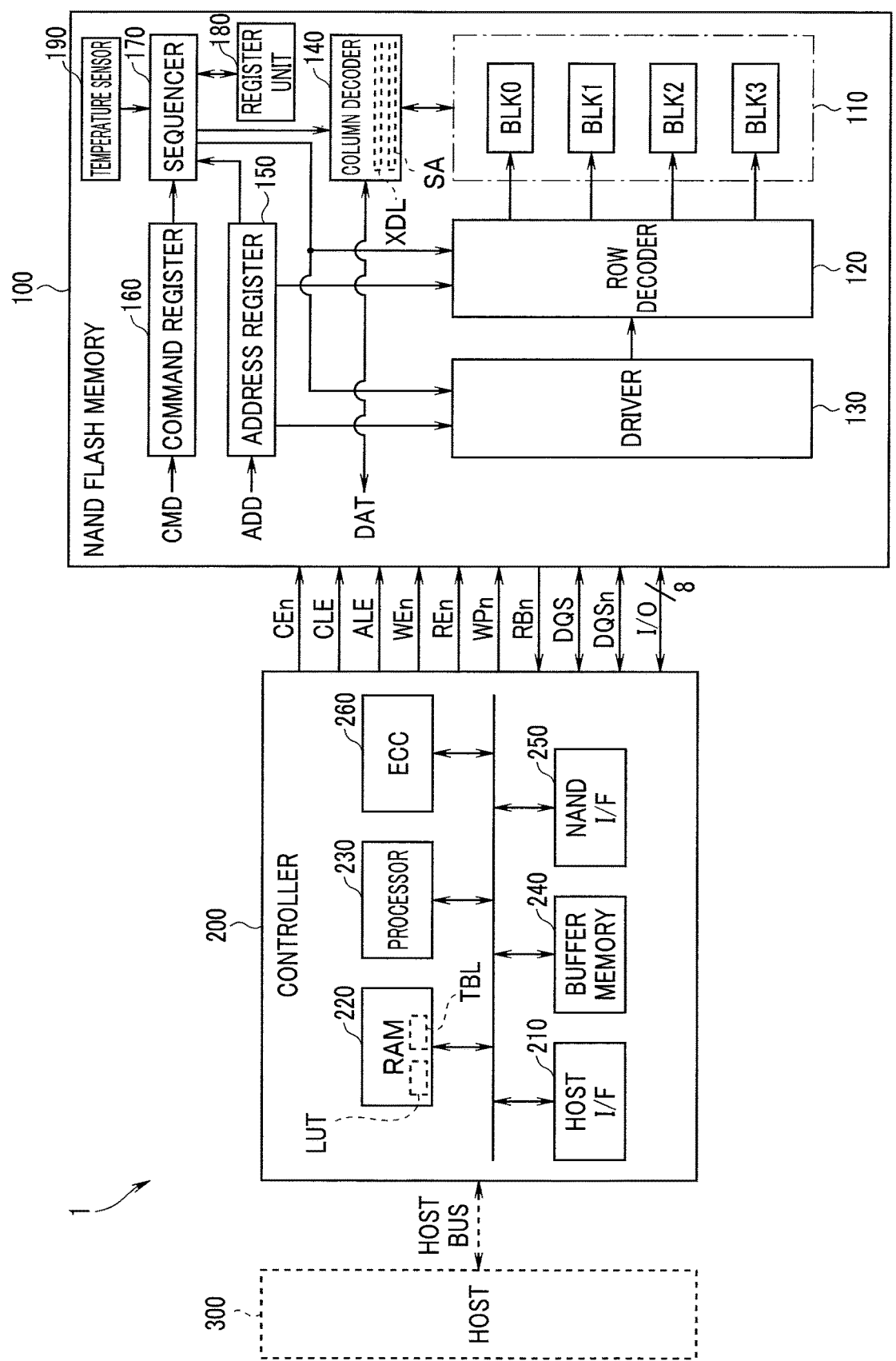
FIG. 1 is a block diagram illustrating a configuration of a memory system according to a first embodiment.

An entire configuration of the memory system according to the present embodiment will be roughly described first using FIG. 1.

FIG. 1 is a block diagram illustrating a configuration of the memory system according to the present embodiment. As illustrated, a memory system 1 includes a NAND flash memory (hereinafter, referred to as a NAND memory) 100, and a memory controller (hereinafter, also simply referred to as a controller) 200. The NAND memory 100 and the controller 200 are formed on, for example, one substrate. The memory system 1 is used in, for example, a memory card such as an SD card, or an SSD (solid state drive).

The NAND memory 100 is a non-volatile memory. The NAND memory 100 includes a plurality of memory cells and stores data in a non-volatile manner. The controller 200 is connected to the NAND memory 100 with a NAND bus. The controller 200 is connected to host equipment 300 (indicated with a dotted line) with a host bus. Further, the controller 200 is a memory controller which controls the NAND memory 100 and which accesses the NAND memory 100 in response to a request received from the host equipment 300. The host equipment 300 is, for example, a digital camera, or a personal computer, and the host bus is, for example, a bus which conforms to an SD interface. The NAND bus is a bus which transmits and receives signals which conform to the NAND interface.

Various kinds of signals are transmitted and received between the NAND memory 100 and the controller 200 via a NAND interface (I/F) circuit 250. A chip enable signal CEn, a command latch enable signal CLE, an address latch enable signal ALE, a write enable signal WEn, a read enable signal REn and a write protect signal WPn are supplied from the controller 200 to the NAND memory 100. A ready/busy signal RBn is supplied from the NAND memory 100 to the controller 200. An input/output signal I/O and a data strobe signal DQS/DQSn are transmitted and received between the controller 200 and the NAND memory 100.

The chip enable signal CEn, which is a signal for enabling the NAND memory 100, is asserted at a low level. The command latch enable signal CLE and the address latch enable signal ALE are signals for notifying the NAND memory 100 that the input/output signals I/O are respectively a command and an address. The write enable signal WEn, which is asserted at a low level, is a signal for notifying the NAND memory 100 that the input/output signal I/O is written in the NAND memory 100. The read enable signal REn, which is also asserted at a low level, is a signal for causing read data from the NAND memory 100 to be output as the input/output signal I/O. The write protect signal WPn is a signal for instructing the NAND memory 100 to prohibit writing and erasure of data. The data strobe signal DQS/DQSn is a signal for controlling timings for inputting and outputting the input/output signal I/O.

The ready/busy signal RBn is a signal indicating whether the NAND memory 100 is in a ready state (state where the NAND memory 100 can receive a command from the controller 200) or in a busy state (state where the NAND memory 100 cannot receive a command from the controller 200), and a low level indicates a busy state. The input/output signal I/O is, for example, a signal of eight bits. Further, the input/output signal I/O is data entity transmitted and received between the NAND memory 100 and the controller 200, and is a command, an address, write data, read data, or the like.

[Configuration of Controller]

A configuration of the controller 200 will be described in detail next. As illustrated in FIG. 1, the controller 200 is a circuit including a host I/F (interface) circuit 210, a RAM (random access memory) 220 and a processor 230 including a CPU (central processing unit), a buffer memory 240, a NAND interface circuit 250, and an ECC (error checking and correcting) circuit 260.

The host interface circuit 210, which is connected to the host equipment 300 via a host bus, transfers a request and data received from the host equipment 300 to the processor 230 and the buffer memory 240, respectively. Further, the host interface circuit 210 transfers data within the buffer memory 240 to the host equipment 300 in response to a command of the processor 230.

The RAM 220 is, for example, a semiconductor memory such as a DRAM and an SRAM. The RAM 220 is used as a work area of the processor 230. Further, the RAM 220 stores firmware for managing the NAND memory 100 and management information MI. The management information MI is a look-up table (LUT), shift table information (TBL), or the like. The shift table information TBL includes shift information. The shift information is information for shifting a read level of data when the controller 200 executes data read processing.

The processor 230 controls the whole operation of the controller 200. For example, the processor 230 issues a read command to the NAND interface circuit 250 in response to a data read request when the data read request is received from the host equipment 300. Also when a data write request and a data erase request are received from the host equipment 300, the processor 230 issues commands corresponding to the received requests to the NAND interface circuit 250 in a similar manner. Further, the processor 230 executes various kinds of processing such as wear leveling for managing the NAND memory 100.

The buffer memory 240 temporarily stores write data and read data.

The NAND interface circuit 250 is connected to the NAND memory 100 via the NAND bus and controls communication with the NAND memory 100. Further, the NAND interface circuit 250 transmits various kinds of signals including a command, data, and the like, to the NAND memory 100 on the basis of the command received from the processor 230 and receives various kinds of signals and data from the NAND memory 100.

The NAND interface circuit 250 outputs the chip enable signal CEn, the command latch enable signal CLE, the address latch enable signal ALE, the write enable signal WEn and the read enable signal REn to the NAND memory 100 on the basis of the command received from the processor 230. Further, upon data writing, the NAND interface circuit 250 transfers the write command issued at the processor 230 and the write data within the buffer memory 240 to the NAND memory 100 as the input/output signal I/O. Still further, upon data reading, the NAND interface circuit 250 transfers the read command issued at the processor 230 to the NAND memory 100 as the input/output signal I/O and further, receives the data read from the NAND memory 100 as the input/output signal I/O and transfers the data to the buffer memory 240.

The ECC circuit 260 performs error detection and error correction processing regarding data to be stored in the NAND memory 100. In other words, upon data writing, the ECC circuit 260 generates an error correction code and provides the error correction code to the write data, and upon data reading, the ECC circuit 260 decodes data while correcting an error. The ECC circuit 260 notifies the processor 230 of an ECC error when decoding of the read data has failed.

[Configuration of NAND Flash Memory]

A configuration of the NAND memory 100 will be described next. As illustrated in FIG. 1, the NAND memory 100 includes a memory cell array 110, a row decoder 120, a driver circuit 130, a column decoder 140, an address register 150, a command register 160, a sequencer 170, a register unit 180 and a temperature sensor 190.

The memory cell array 110 includes a plurality of blocks BLK including a plurality of non-volatile memory cells associated with rows and columns. The block BLK is used as, for example, a data erasing unit. FIG. 1 illustrates four blocks BLK0 to BLK3 as an example. Further, the memory cell array 110 stores data provided from the controller 200 in a non-volatile manner.

The row decoder 120 selects one of the blocks BLK0 to BLK3 on the basis of a block address BA within the address register 150 and further selects a word line WL in the selected block BLK.

The driver circuit 130 supplies a voltage to the selected block BLK via the row decoder 120 on the basis of a page address PA within the address register 150.

The column decoder 140 includes a data latch circuit XDL and a sense amplifier SA. The sense amplifier SA includes a plurality of sense amplifier circuits. The sense amplifier SA performs sense operation when data is read. The sense operation is operation of sensing data read from the memory cell array 110 and performing necessary calculation. The data latch circuit XDL includes a plurality of latch circuits for inputting and outputting data. Further, the column decoder 140 outputs the read data DAT to the controller 200 via the data latch circuit XDL. The column decoder 140 executes operation of writing data in the memory cell array 110 after the write data DAT received from the controller 200 is received at the data latch circuit XDL upon data writing.

The read data and the write data are user data. The data latch circuit XDL includes a user data storage portion. The user data storage portion is a circuit portion in which the user data can be stored. The data latch circuit XDL further includes a redundant portion in which address information, and the like, which will be described later can also be stored. In other words, the read data, the write data, the address information, and the like, can be stored in the data latch circuit XDL.

Note that while an example will be described in the present embodiment and other embodiments where the user data storage portion and the redundant portion are provided in the data latch circuit XDL, the user data storage portion and the redundant portion may be provided in other data latch circuits, for example, a data latch circuit ADL or BDL. In other words, the data latch circuit ADL, BDL or CDL may be used as a data latch circuit which temporarily stores log data which will be described later.

The address register 150 stores the address ADD received from the controller 200. The address ADD includes the block address BA and the page address PA described above. In other words, the address register 150 stores address information. The command register 160 stores the command CMD received from the controller 200.

The sequencer 170 is a control circuit which controls the whole operation of the NAND memory 100 on the basis of the command CMD stored in the command register 160.

The sequencer 170 reads data, writes data and erases data on the basis of the command CMD from the controller 200.

Further, the sequencer 170 executes log data storage processing as will be described later. To execute the processing, the sequencer 170 can acquire an address from the address register 150. Still further, the sequencer 170 can transfer data to the column decoder 140.

The register unit 180 includes a plurality of registers. A temperature code of the temperature sensor 190, and the like, can be stored in the register unit 180.

The temperature sensor 190 generates a temperature code indicating a temperature of the NAND memory 100. The sequencer 170 periodically acquires the temperature code. The temperature code is temperature information of the NAND memory 100. The temperature code is use state data of the NAND memory 100.

Figure 2:
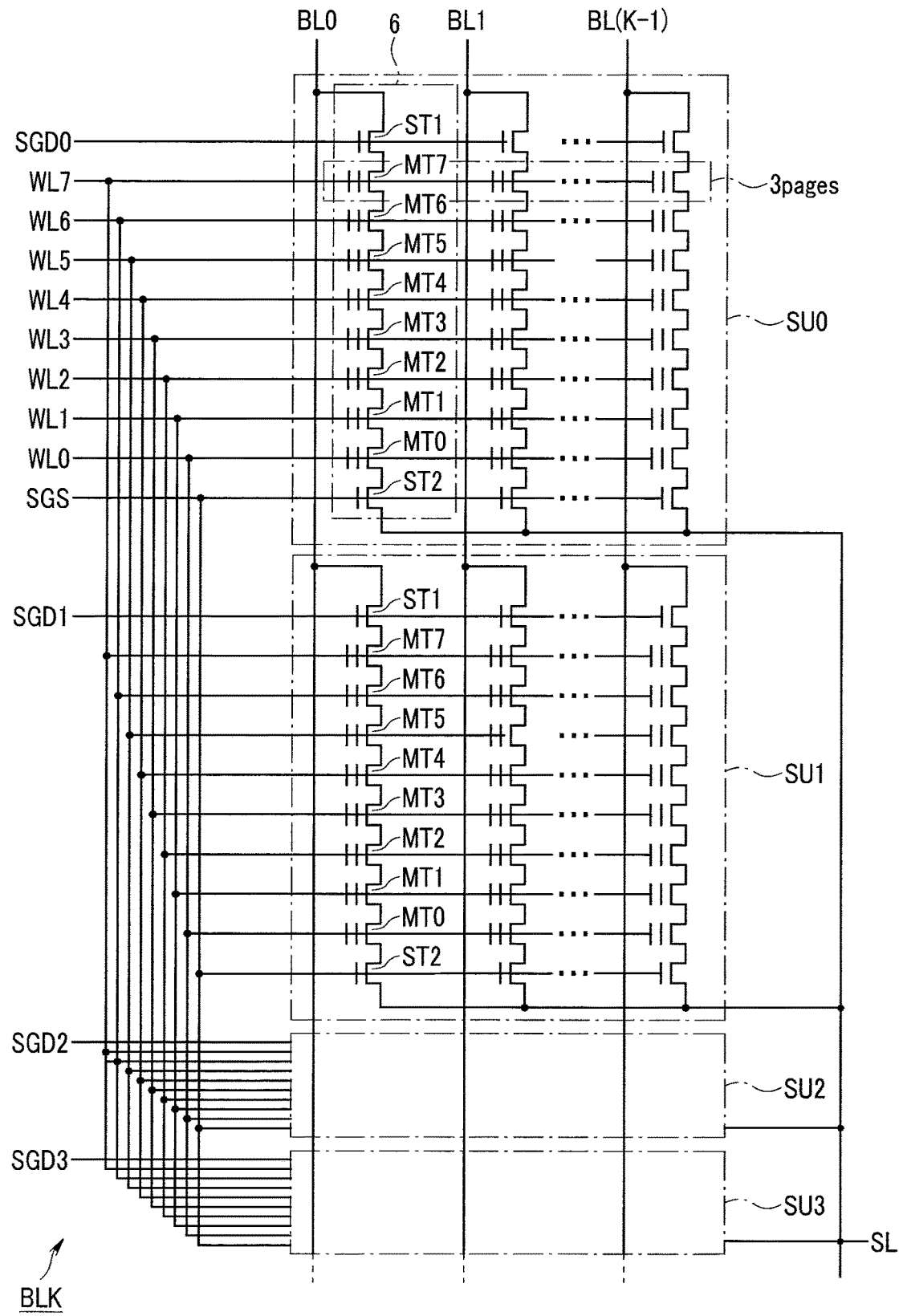
FIG. 2 is a circuit diagram illustrating a configuration of a memory cell array according to the first embodiment.

A configuration of the block BLK described above will be described next using FIG. 2. FIG. 2 is a circuit diagram illustrating a configuration of the memory cell array according to the present embodiment. As illustrated, one block BLK includes, for example, four string units SU (SU0 to SU3). Further, each string unit SU includes a plurality of NAND strings 6.

Each NAND string 6 includes, for example, eight memory cell transistors MT (MT0 to MT7) and two select transistors ST1 and ST2. Each memory cell transistor MT includes a control gate and a charge accumulation layer and stores data in a non-volatile manner. Further, a plurality of (for example, eight) memory cell transistors MT are connected in series between a source of the select transistor ST1 and a drain of the select transistor ST2.

The gates of the select transistors ST1 at the respective string units SU0 to SU3 are respectively connected to select gate lines SGD0 to SGD3. In contrast, the gates of the select transistors ST2 at the respective string units SU0 to SU3 are, for example, commonly connected to the select gate line SGS. Of course, the gates of the select transistors ST2 at the respective string units SU0 to SU3 may be connected to the select gate lines SGSO to SGS3 different for each string unit. Further, control gates of the memory transistors MT0 to MT7 within the same block BLK are commonly connected to the respective word lines WL0 to WL7.

Further, drains of the select transistors ST1 of a plurality of NAND strings 6 in the same column within the memory cell array 110 are commonly connected to bit lines BL (BL0 to BL(K−1) where K is a natural number equal to or greater than 2). In other words, the bit lines BL commonly connect a plurality of NAND strings 6 among the plurality of blocks BLK. Further, sources of the plurality of select transistors ST2 are commonly connected to a source line SL.

In other words, each string unit SU includes a plurality of NAND strings 6 which are connected to a plurality of bit lines BL which are different from each other, and which are connected to the same select gate line SGD. Further, each block BLK includes a plurality of string units SU. Still further, the memory cell array 110 is an aggregate of a plurality of blocks BLK to which respective bit lines BL are commonly connected.

Figure 3:
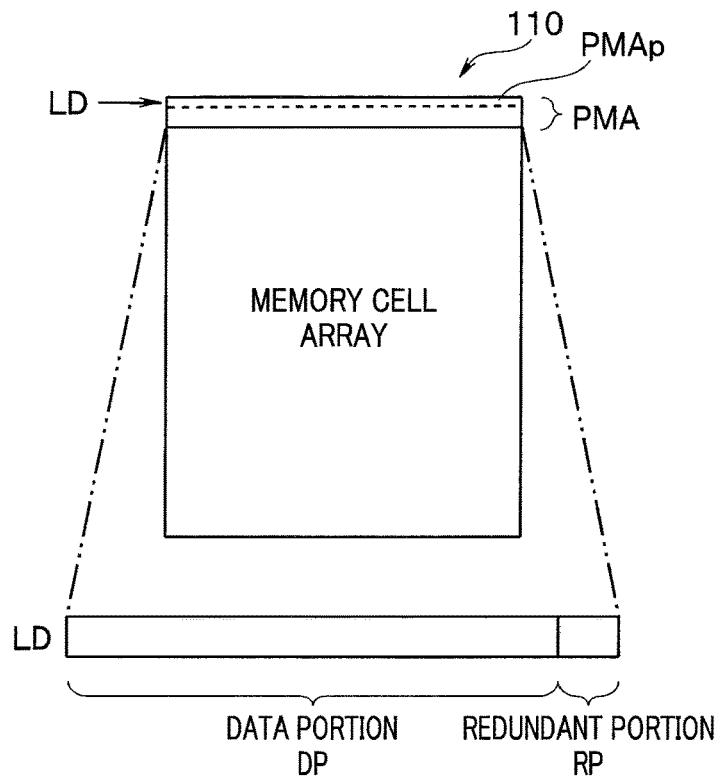
FIG. 3 is a memory map indicating a memory area of a memory cell array of a NAND flash memory according to the first embodiment.

FIG. 3 is a memory map indicating a memory area of the memory cell array 110 of the NAND memory 100.

The memory cell array 110 includes a predetermined memory area PMA in which the user data is not written in addition to a memory area in which the user data is stored. The predetermined memory area PMA is a memory area different from the memory area in which the user data is stored. The user data is therefore not written in the predetermined memory area PMA.

The predetermined memory area PMA includes a plurality of log data memory areas PMAp. Each log data memory area PMAp has a data size which allows a plurality of pieces of log data LD to be stored.

The log data LD includes a data portion DP including error occurrence data which will be described later, and a redundant portion RP including address information (which includes information including the block address BA and the page address PA). The data portion DP including the error occurrence data corresponds to a user data storage portion of the data latch circuit XDL, and the redundant portion RP including the address information (the block address BA and the page address PA) corresponds to the redundant portion of the data latch circuit XDL.

In FIG. 3, the predetermined memory area PMA includes a plurality of log data memory areas PMAp. Each log data memory area PMAp includes at least one block BLK. Each block BLK includes a plurality of pages. Reading of data from the memory cell array 110 and writing of data in the memory cell array 110 are performed in units of a page which is an aggregate of data of a plurality of bits. Each page can be designated with the page address PA. One piece of log data LD can be stored in each page. Thus, one piece of log data LD is stored in one page within one block BLK within the predetermined memory area PMA. The log data LD is sequentially stored in a plurality of consecutive pages within one block BLK. In a case where each log data memory area PMAp includes a plurality of blocks BLK, if the log data LD is stored in all pages within one block BLK, the log data LD is stored in the next block BLK within the predetermined memory area PMA. Thus, after the log data LD is stored, the next log data LD can be stored while the stored log data LD is stored by, for example, the page address PA within the predetermined memory area PMA being incremented by one each time. An address at which the next log data LD is to be stored is designated by an address pointer managed by the sequencer 170. Here, after one piece of log data LD is stored, the page address PA indicated by the address pointer is incremented by one each time, the page address PA indicating the address at which the next log data LD is to be stored may be changed by the page address PA indicated by the address pointer being incremented by a predetermined number such as two and three each time.

Figure 4:
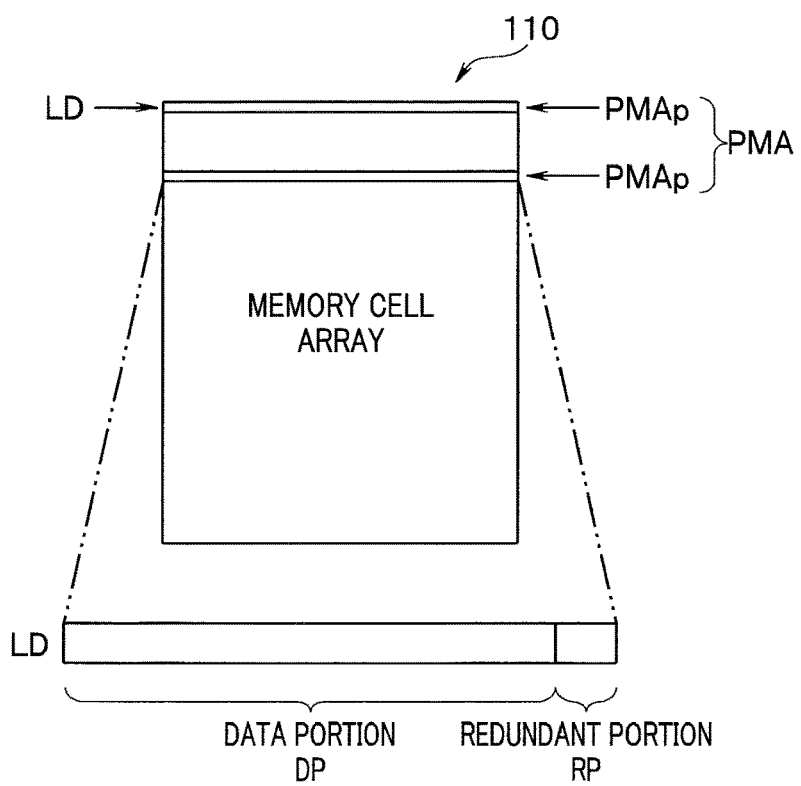
FIG. 4 is a memory map indicating an example of a predetermined memory area in which a plurality of log data memory areas are disposed separately from each other, according to the first embodiment.

FIG. 4 is a memory map indicating an example of the predetermined memory area PMA in which the plurality of log data memory areas PMAp are disposed separately from each other.

In FIG. 4, two log data memory areas PMAp are provided separately from each other. Within each block BLK of the log data memory area PMAp, every time the log data LD is stored, the next log data LD is stored while the stored log data LD is stored by the page address PA being incremented by one each time. If the log data LD is stored in all the pages within one block BLK, after the log data LD is stored, the next log data LD can be stored in the next block BLK while the stored log data LD is stored by, for example, the block number being incremented by one each time. If the log data LD is stored in all the pages of all the blocks BLK within one log data memory area PMAp, the block address BA and the page address PA of the other log data memory area PMAp are designated, and the log data LD is stored in the other log data memory area PMAp.

[Log Data Storage Processing in a Case of Read Error]

As described above, the sequencer 170 reads data, writes data and erases data on the basis of the command CMD from the controller 200. The present embodiment relates to storage of the log data LD in a case where a read error occurs.

Figure 5:
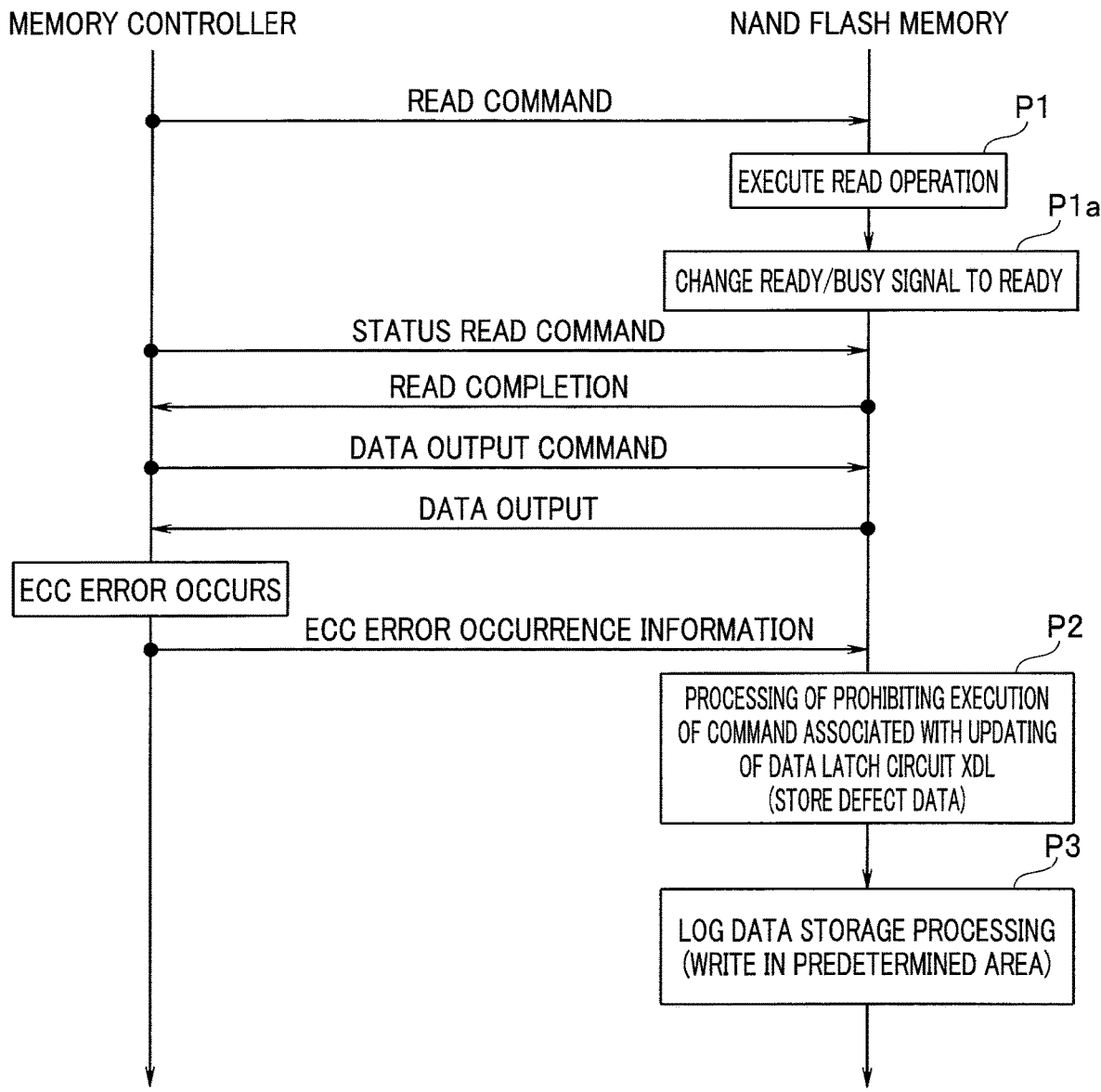
FIG. 5 is a timing chart indicating timings for transmitting and receiving data between a memory controller and the NAND flash memory in a case where data is read, according to the first embodiment.

FIG. 5 is a timing chart indicating timings for transmitting and receiving data between the controller 200 and the NAND memory 100 in a case where data is read.

When the controller 200 issues a read command to the NAND memory 100, the sequencer 170 executes read operation (P1). In other words, the sequencer 170 reads data from the NAND memory 100 in accordance with the read command and stores the read data in the data latch circuit XDL. During the read operation (P1), a state of the ready/busy signal becomes a busy state, and the status register within the register unit 180 is set to indicate a busy state. After the read operation is finished, the state of the ready/busy signal becomes a ready state (P1a), and the status register is set to indicate a ready state. The controller 200 can confirm the state of the status register by issuing a status read command. The controller 200 judges that the read operation has been completed from the ready/busy signal or the state of the status register.

The controller 200 issues a data output command to the NAND memory 100. The sequencer 170 outputs data in the data latch circuit XDL to the controller 200 in accordance with the data output command. In other words, the sequencer 170 outputs the read data to the memory controller 200.

The ECC circuit 260 of the controller 200 detects an error and corrects an error of the received data. In a case where an error is detected in the received data and correction of the error has failed, the processor 230 issues ECC error occurrence information to the NAND memory 100.

In a case where an ECC error occurs, the processor 230 performs processing of setting a block in which the ECC error has occurred as a defective block.

The sequencer 170 executes prohibition processing of prohibiting acceptance of a predetermined command (P2) in a case where the ECC error occurrence information is received. Here, the predetermined command is a command associated with updating of data stored in the data latch circuit XDL by the memory controller 200. After the prohibition processing P2, the read data is left stored in the data latch circuit XDL. The sequencer 170 executes log data storage processing (P3).

As described above, in a case where a notification of the read error is received, the sequencer 170 performs processing of prohibiting updating of data in the data latch circuit XDL and writes predetermined data in the predetermined memory area PMA.

Figure 6:
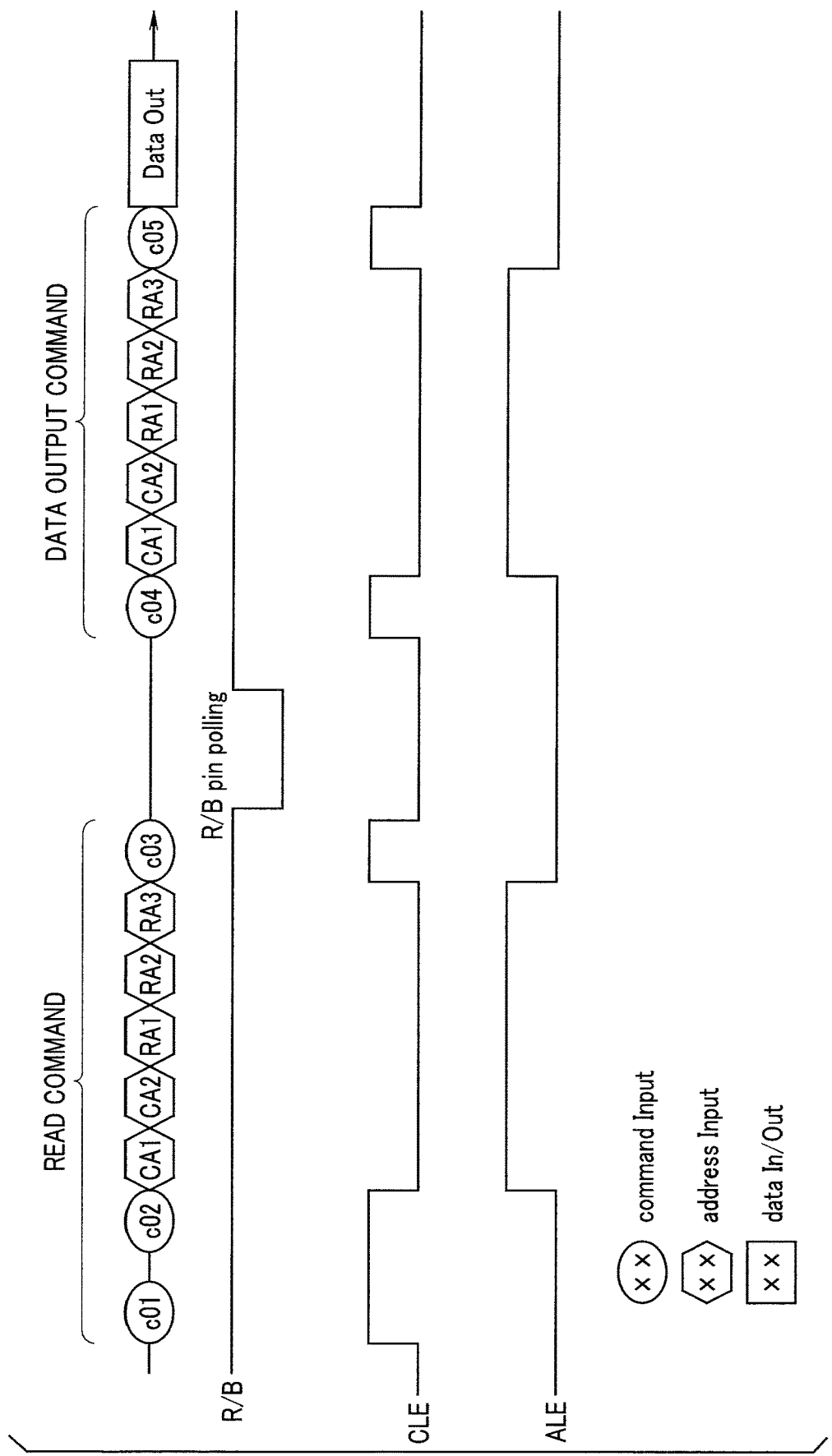
FIG. 6 is a diagram illustrating a data read command sequence according to the first embodiment.

FIG. 6 is a diagram illustrating a data read command sequence. In the data read command sequence, the sequencer 170 first outputs a reservation command "c01". After the reservation command "c01", a command "c02" is output. The command "c02" makes a notification of execution of read operation. When the commands "c01" and "c02" are output, the command latch enable signal CLE becomes high. When output of the commands "c01" and "c02" is finished, the command latch enable signal CLE becomes low. After the command "c02", address data including two column addresses "CA1" and "CA2" and three row addresses "RA1", "RA2" and "RA3" is output. When the address data "CA1", "CA2", "RA1", "RA2" and "RA3" is output, the address latch enable signal ALE becomes high. When output of the address data is finished, the address latch enable signal ALE becomes low. A command "c03" which gives an instruction to execute read operation is output subsequent to the address data. When the command "c03" is output, the command latch enable signal CLE becomes high. When output of the command "c03" is finished, the command latch enable signal CLE becomes low. When the command "c03" is output, the ready/busy signal RBn becomes low.

When the ready/busy signal RBn becomes high, the controller 200 outputs a data output command. A command "c04" is first output. The command "c04" makes a notification of execution of data output operation. When the command "c04" is output, the command latch enable signal CLE becomes high. When output of the command "c04" is finished, the command latch enable signal CLE becomes low. After the command "c04", five pieces of address data are output. When the address data is output, the address latch enable signal ALE becomes high. When output of the address data is finished, the address latch enable signal ALE becomes low. A command "c05" which gives an instruction to execute data output operation is output subsequent to the address data. When the command "c05" is output, the command latch enable signal CLE becomes high. When output of the command "c05" is finished, the command latch enable signal CLE becomes low. When the command "c05" is output, the sequencer 170 outputs data in the data latch circuit XDL.

The read command is executed as described above, so that the controller 200 can read data from the NAND memory 100.

Figure 7:
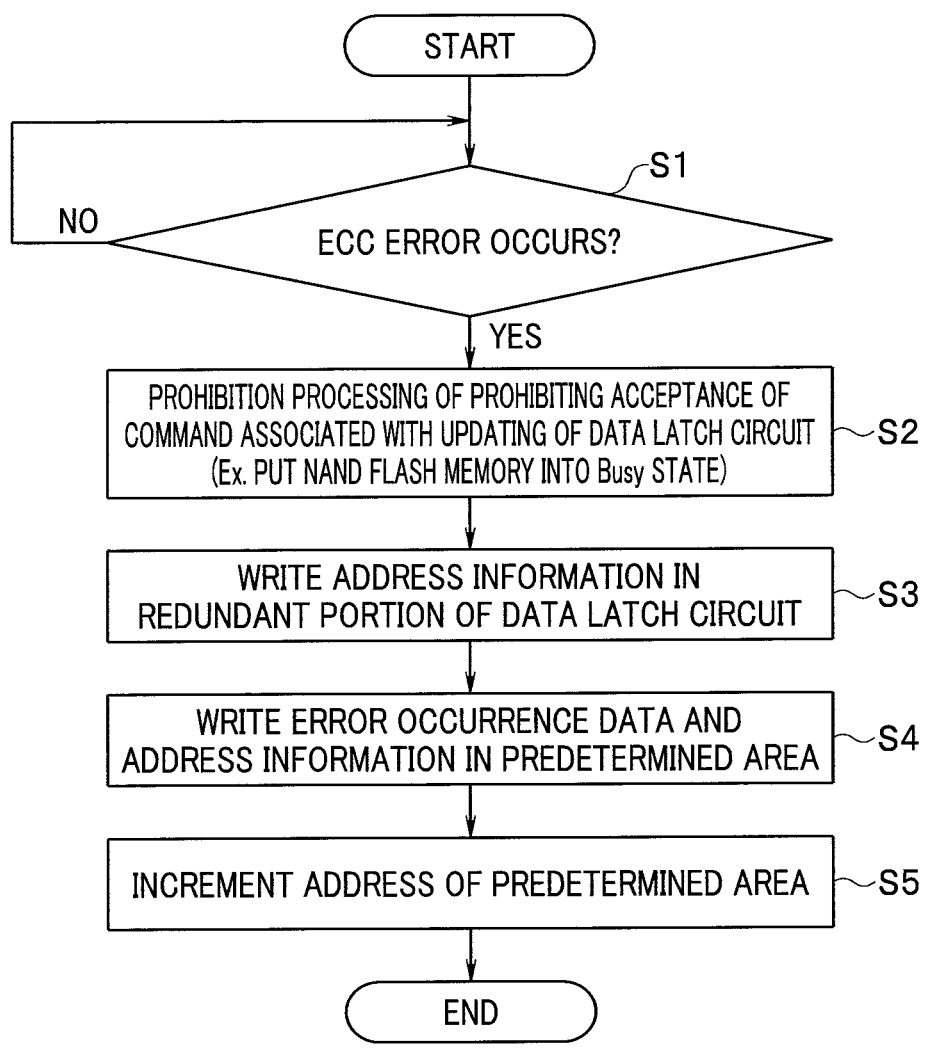
FIG. 7 is a flowchart illustrating an example of log data storage processing of a sequencer when ECC error occurrence information is received, according to the first embodiment.

FIG. 7 is a flowchart illustrating an example of log data storage processing of the sequencer 170 when the ECC error occurrence information has been received.

The sequencer 170 determines whether the ECC error occurrence information has been received (S1). In a case where the ECC error occurrence information is received, the sequencer 170 executes processing in S2 and subsequent processing. In a case where the ECC error occurrence information is not received (S1: NO), the sequencer 170 does not execute processing in S2 and subsequent processing.

In a case where the ECC error occurrence information is received (S1: YES), the sequencer 170 executes predetermined prohibition processing P2 (S2). The predetermined prohibition processing P2 is processing of prohibiting acceptance of a command associated with updating of the data latch circuit XDL.

In the prohibition processing P2, for example, the ready/busy signal RBn is supplied from the NAND memory 100 to the controller 200 while a level of the ready/busy signal RBn is made a low level. When the level of the ready/busy signal RBn is a low level, the controller 200 does not output a command to the NAND memory 100.

After S2, the sequencer 170 writes the address information regarding an address at which the ECC error has occurred in the redundant portion of the data latch circuit XDL (S3).

After S3, the sequencer 170 transfers the data in which the ECC error has occurred (that is, error occurrence data) and address information to one data memory area of the predetermined memory area PMA from the data latch circuit XDL (S4).

In other words, in a case where a notification of the read error is received from the memory controller 200, the sequencer 170 writes predetermined data in the predetermined memory area PMA. The predetermined data includes the read data and address information regarding the read command. More specifically, the sequencer 170 writes data of the data latch circuit XDL in one data memory area of the predetermined memory area PMA as the log data LD.

The sequencer 170 increments the address of the address pointer of the predetermined memory area PMA (S5). The address information of the address pointer is stored in the predetermined memory area PMA.

As described above, the predetermined memory area PMA includes a plurality of log data memory areas PMAp. The sequencer 170 manages the address pointer. The address pointer indicates an address of the log data memory area PMAp in which the log data LD is to be stored next in the predetermined memory area PMA. When the sequencer 170 writes the log data LD in the log data memory area PMAp, the sequencer 170 increments the address of the log data memory area PMAp. A value (address) of the address pointer is changed by being incremented by one, and data is not overwritten in the log data memory area PMAp in which the log data LD has been written once. As a result, the log data LD is stored.

As described above, the sequencer 170 executes processing of protecting predetermined data written in the predetermined memory area PMA after writing the predetermined data in the predetermined memory area PMA.

In the log data memory area PMAp, the error occurrence data and the address information (the block address BA and the page address PA) are stored.

Figure 8:
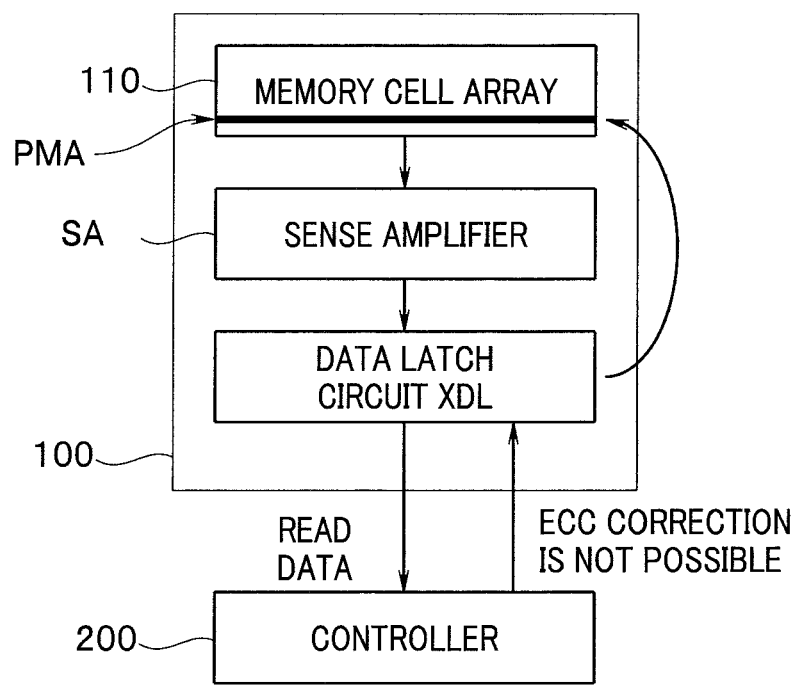
FIG. 8 is a diagram illustrating flow of storing log data in a predetermined memory area in a case where a read error occurs, according to the first embodiment.

FIG. 8 is a diagram illustrating flow of storage of log data in the predetermined memory area PMA in a case where a read error has occurred.

The controller 200 outputs the ECC error occurrence information to the NAND memory 100 in a case where an error of the read data cannot be corrected with an ECC. The sequencer 170 stores the log data LD of the data latch circuit XDL in the predetermined memory area PMA within the memory cell array 110.

The log data LD is stored in a memory area at an address indicated with the address pointer in the memory area PMA.

As described above, according to the first embodiment described above, in a case where a read error occurs in the memory system 1, the sequencer 170 autonomously stores the log data LD in the predetermined memory area PMA of the NAND memory 100. The log data LD includes the error occurrence data regarding the read error and the address information (the block address BA and the page address PA). It is therefore possible to analyze a failure using the log data LD in the NAND memory 100.

Second Embodiment

While in the first embodiment, the log data LD is stored in a case where a read error has occurred, in the second embodiment, the log data LD is stored in the predetermined memory area PMA in a case where a write error has occurred.

A configuration of the memory system in the second embodiment is the same as the configuration of the memory system 1 in the first embodiment, and a configuration of the NAND memory 100 and a configuration of the memory controller 200 are respectively the same as the configuration of the NAND memory 100 and the configuration of the memory controller 200 in the first embodiment. Thus, the same reference numerals will be used for the same components, and description will be omitted.

[Log Data Storage Processing in a Case of Write Error]

Figure 9:
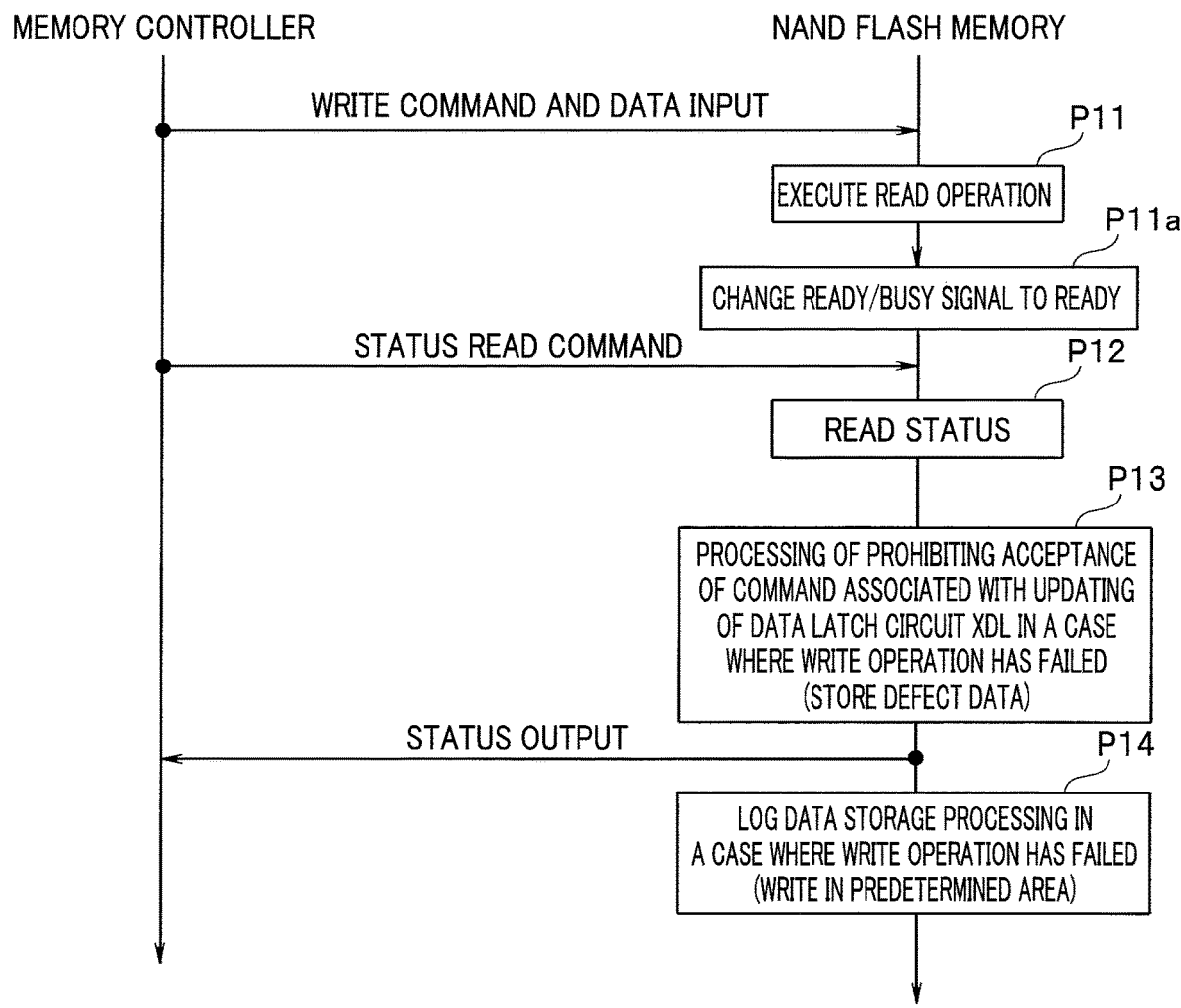
FIG. 9 is a timing chart indicating timings for transmitting and receiving data between a controller and a NAND flash memory in a case where data is written, according to a second embodiment.

FIG. 9 is a timing chart indicating timings for transmitting and receiving data between the controller 200 and the NAND memory 100 in a case where data is written.

In a case where the controller 200 issues a write command to the NAND memory 100, the sequencer 170 executes write operation (P11). The write operation includes program operation and verify operation. The program operation is operation of increasing a threshold by injecting electrons into a charge accumulation layer (or maintaining a threshold by prohibiting injection). The verify operation is operation of determining whether or not a threshold of the memory cell transistor MT reaches a target level by reading data after the program operation.

During the write operation (P11), a state of the ready/busy signal becomes a busy state, and the status register within the register unit 180 is set to indicate a busy state. When the write operation is finished, the state of the ready/busy signal becomes a ready state (P11a), and the status register is set to indicate a ready state. The controller 200 issues a status read command to the NAND memory 100. The sequencer 170 executes status read processing (P12) in accordance with the status read command. The status read processing is processing of reading status data indicating whether the write operation has passed or failed.

In a case where the write operation has failed (that is, a write error), the sequencer 170 executes prohibition processing of prohibiting acceptance of a predetermined command (P13). Here, the predetermined command is a command associated with updating of data stored in the data latch circuit XDL by the memory controller 200. After the prohibition processing P13, the write data (expected value), that is, data in which the write error has occurred is left stored in the data latch circuit XDL.

The sequencer 170 outputs the status data to the controller 200.

In a case where the write operation has failed, the sequencer 170 executes log data storage processing (P14) after outputting the status data.

As described above, in a case where a write error occurs, the sequencer 170 performs processing of prohibiting updating of data in the data latch circuit XDL and writes predetermined data in the predetermined memory area PMA.

Figure 10:
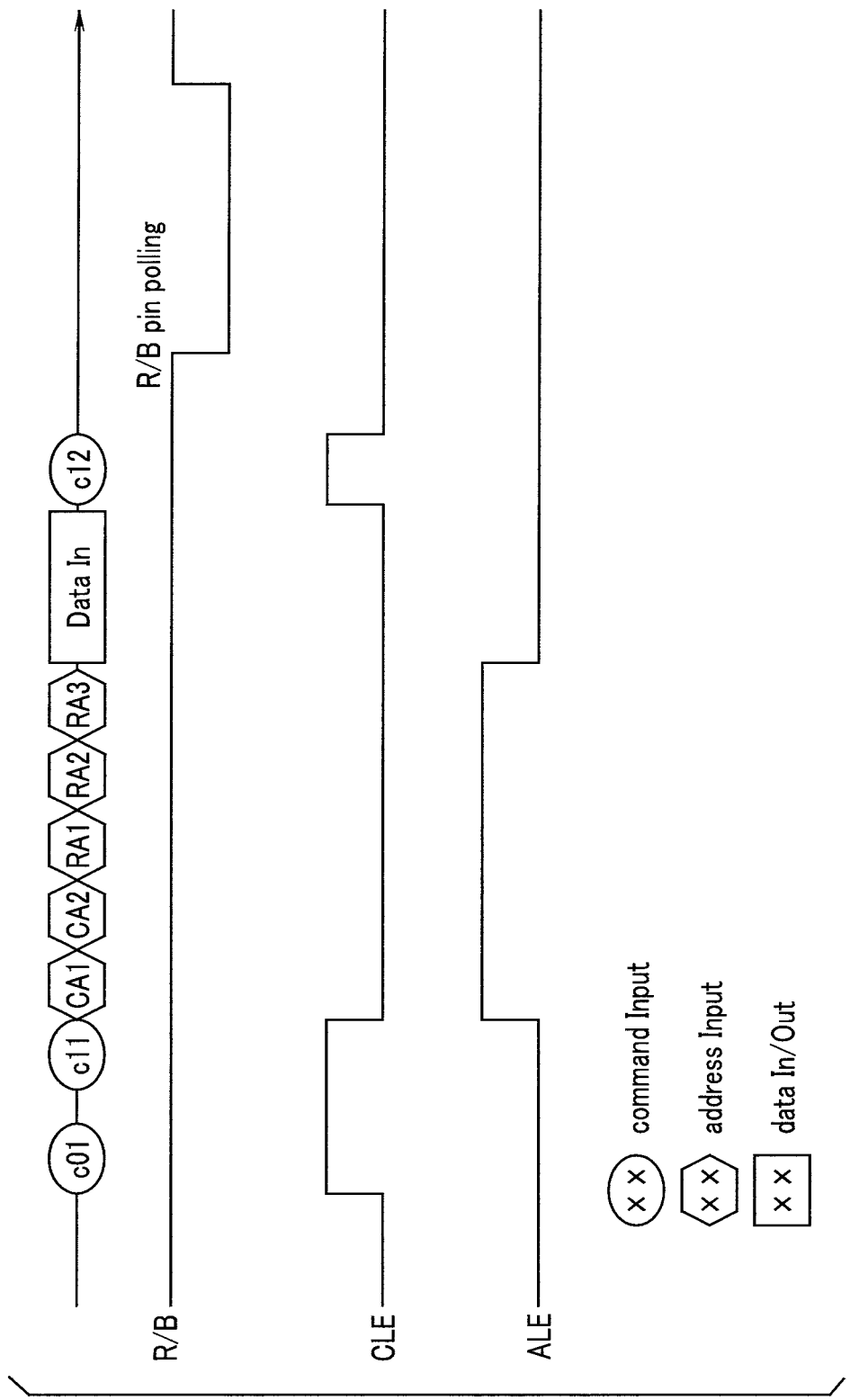
FIG. 10 is a diagram illustrating a data write command sequence according to the second embodiment.

FIG. 10 is a diagram illustrating a data write command sequence. In the write command sequence, the sequencer 170 first outputs a reservation command "c01". After the reservation command "c01", a command "c11" is output. The command "c11" is a command which makes a notification of execution of write operation. While the commands "c01" and "c11" are output, the command latch enable signal CLE becomes high. When output of the commands "c01" and "c11" is finished, the command latch enable signal CLE becomes low. After the command "c11", address data including two column addresses "CA1" and "CA2" and three row addresses "RA1", "RA2" and "RA3" is output. While the address data "CA1", "CA2", "RA1", "RA2" and "RA3" is output, the address latch enable signal ALE becomes high. When output of the address data is finished, the address latch enable signal ALE becomes low. The write data is output subsequent to the address data. The sequencer 170 stores the write data in the data latch circuit XDL. A command "c12" which gives an instruction to execute write operation is output subsequent to the write data. When the command "c12" is output, the command latch enable signal CLE becomes high. When output of the command "c12" is finished, the command latch enable signal CLE becomes low. When the command "c12" is output, the ready/busy signal RBn becomes low until writing is finished.

The write command is executed as described above, so that the controller 200 can write data in the NAND memory 100.

Figure 11:
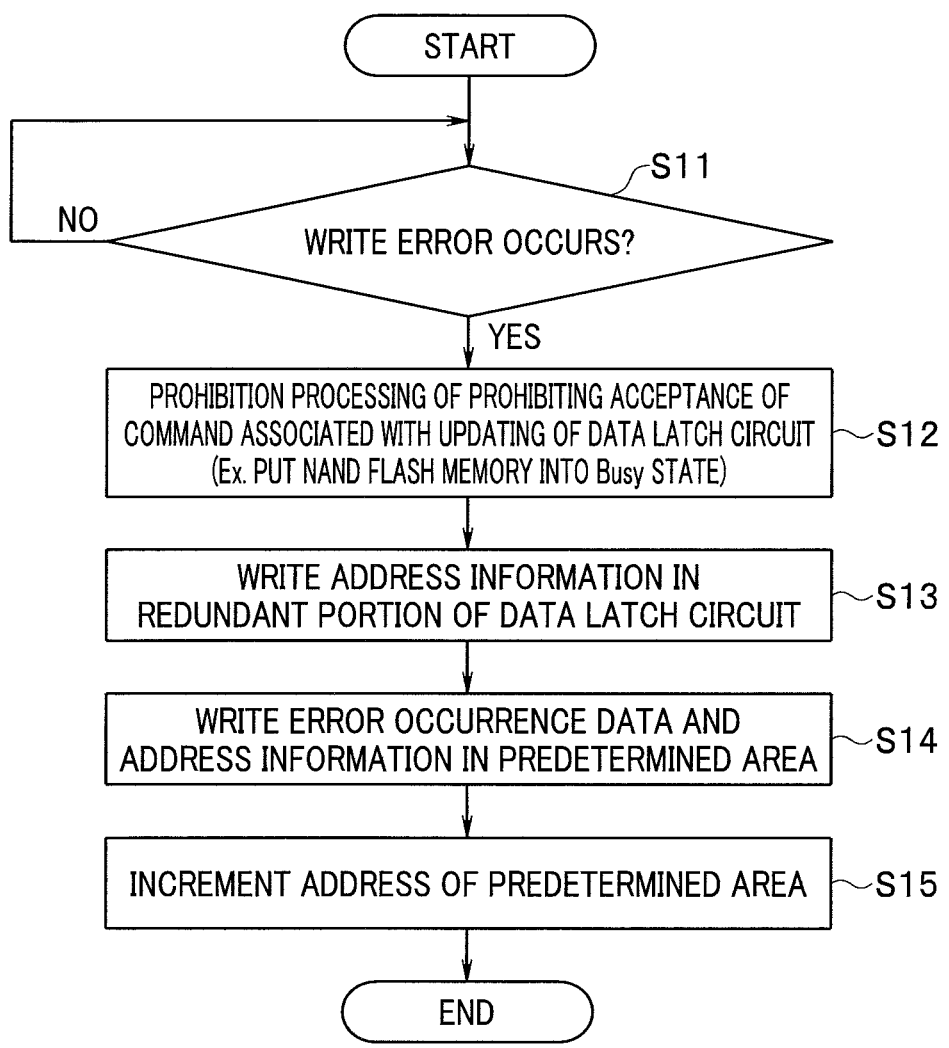
FIG. 11 is a flowchart illustrating an example of log data storage processing of a sequencer when a write error occurs, according to the second embodiment.

FIG. 11 is a flowchart illustrating an example of log data storage processing of the sequencer 170 in a case where a write error occurs.

The sequencer 170 determines whether a write error has occurred (S11). Whether a write error has occurred is determined on the basis of the status data. In the write operation, in a case where it is determined that the threshold of the memory cell transistor MT has not reached a target level in the verify operation after the program operation, a write error occurs.

In a case where a write error occurs, the sequencer 170 executes processing in S12 and subsequent processing. In a case where a write error does not occur, the sequencer 170 does not execute processing in S12 and subsequent processing.

In a case where a write error occurs (S11: YES), the sequencer 170 executes predetermined prohibition processing P13 (S12). The predetermined prohibition processing P13 is processing of prohibiting acceptance of a command associated with updating of the data latch circuit XDL.

In the prohibition processing P13, for example, a level of the ready/busy signal RBn is made a low level, and the ready/busy signal RBn is supplied from the NAND memory 100 to the controller 200. When the level of the ready/busy signal RBn is a low level, the controller 200 does not output a command to the NAND memory 100.

After S12, the sequencer 170 writes address information regarding an address at which the write error has occurred in the redundant portion of the data latch circuit XDL (S13).

After S13, the sequencer 170 transfers data in which the write error has occurred (that is, error occurrence data) and the address information from the data latch circuit XDL to one data memory area of the predetermined memory area PMA (S14). In other words, the sequencer 170 writes data in the NAND memory 100 in accordance with the write command. In a case where a data write error occurs, the sequencer 170 writes predetermined data in the predetermined memory area PMA. The predetermined data includes the write data and the address information regarding the write command. More specifically, the sequencer 170 writes the data of the data latch circuit XDL in one data memory area of the predetermined memory area PMA as the log data LD.

The sequencer 170 increments the address of the address pointer of the predetermined memory area PMA (S15).

As described above, the predetermined memory area PMA includes a plurality of log data memory areas PMAp. The sequencer 170 manages the address pointer indicating an address of the log data memory area PMAp in which the log data LD is to be stored next in the predetermined memory area PMA. When the log data LD is written in the log data memory area PMAp, the address of the log data memory area PMAp is incremented. Data is not overwritten in the log data memory area PMAp in which the log data LD has been written once by the address being incremented by one. As a result, the log data LD is stored.

As described above, the sequencer 170 executes processing of protecting predetermined data written in the predetermined memory area PMA after writing the predetermined data in the predetermined memory area PMA.

The error occurrence data and the address information (the block address BA and the page address PA) are stored in the log data memory area PMAp.

Figure 12:
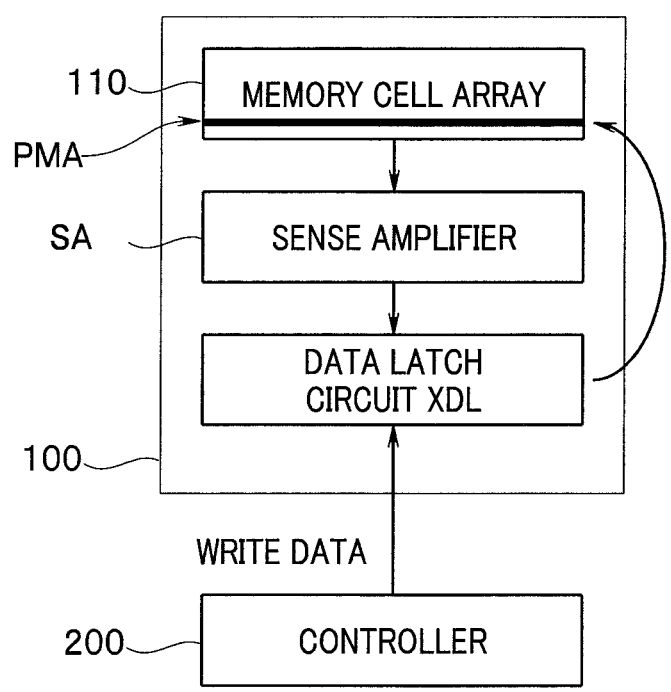
FIG. 12 is a diagram illustrating flow of storing log data in a predetermined memory area in a case where a write error occurs, according to the second embodiment.

FIG. 12 is a diagram illustrating flow of storage of the log data LD in the predetermined memory area PMA in a case where a write error has occurred.

The sequencer 170 stores the log data LD of the data latch circuit XDL in the predetermined memory area PMA in the memory cell array 110 in a case where a write error has occurred.

The log data LD is stored in the memory area PMA at the address indicated with the address pointer.

Thus, in a case where a write error occurs in the NAND memory 100, the sequencer 170 autonomously stores the log data LD in the predetermined memory area PMA. The log data LD includes error occurrence data regarding the write error and the address information (the block address BA and the page address PA). It is therefore possible to analyze a failure using the log data LD in the NAND memory 100.

A modified example will be described next.

While, in the above-described second embodiment, in a case where a write error occurs, the error occurrence data and the address information are stored in the predetermined memory area PMA, the error occurrence data and the address information may be stored in the predetermined memory area PMA every time writing is executed, and in a case where a write error occurs, updating of the data in the predetermined memory area PMA may be prohibited.

Figure 13:
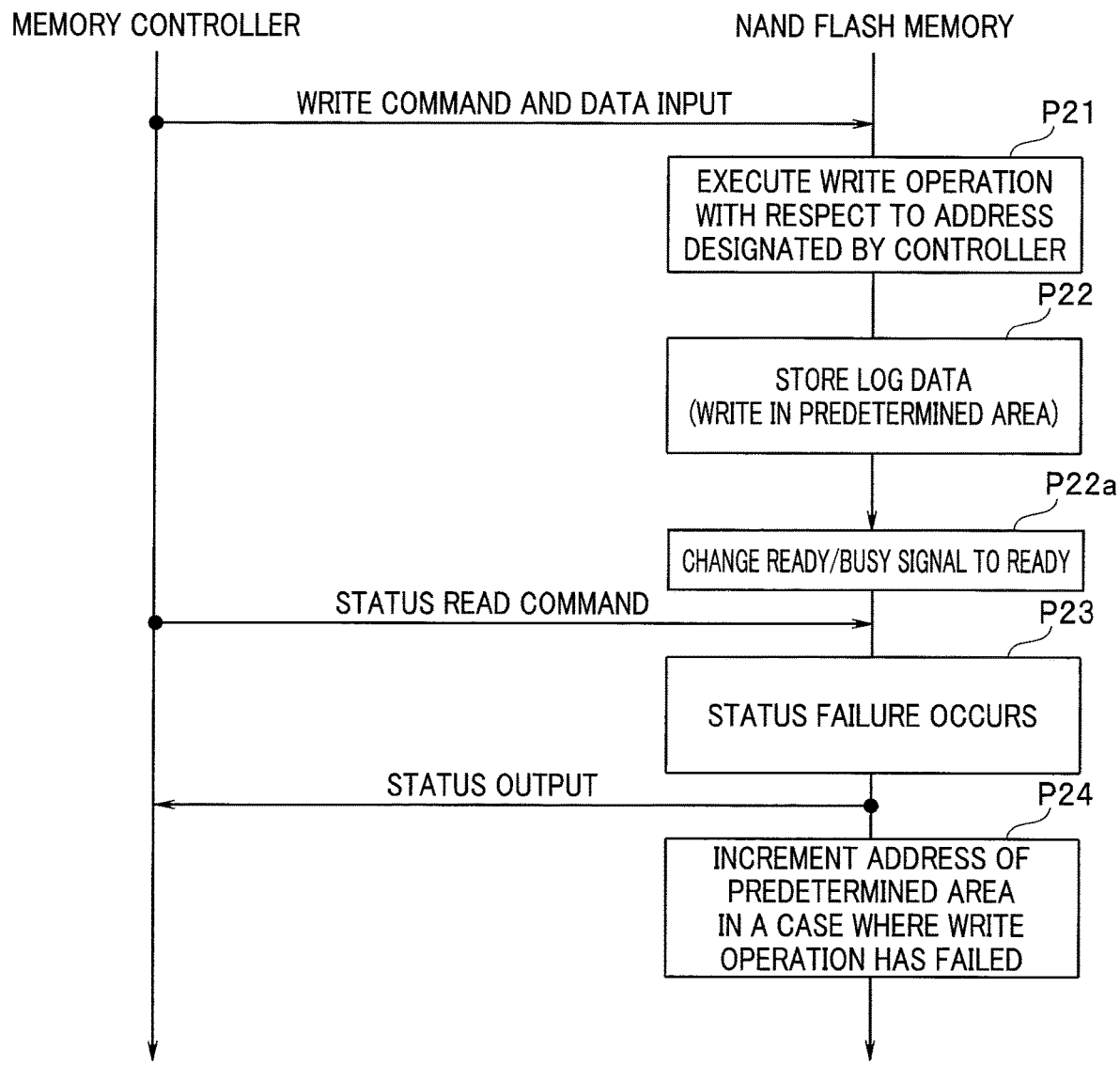
FIG. 13 is a timing chart indicating timings for transmitting and receiving data between a controller and a NAND flash memory in a case where data is written, according to a modified example of the second embodiment.

FIG. 13 is a timing chart indicating timings for transmitting and receiving data between the controller 200 and the NAND memory 100 in a case where data is written in a modified example.

When the controller 200 issues a write command to the NAND memory 100, the sequencer 170 executes write operation (P21) at an address designated by the controller 200.

The sequencer 170 executes log data storage processing (P22). The log data storage processing (P22) is the same as the log data storage processing (P14).

During the write operation (P22), a state of the ready/busy signal becomes a busy state, and the status register within the register unit 180 is set to indicate a busy state. When the write operation is finished, the state of the ready/busy signal becomes a ready state (P22a), and the status register is set to indicate a ready state. The controller 200 issues a status read command to the NAND memory 100. The sequencer 170 determines whether a write error has occurred on the basis of the status data.

In a case where a status failure occurs (P23), status data indicating that writing has failed is output to the controller 200.

In a case where a status failure occurs (P23), the sequencer 170 executes overwrite prohibition processing (P24) after outputting the status data. In the overwrite prohibition processing (P24), the address of the address pointer of the predetermined memory area PMA is incremented. Overwrite prohibition includes a case where overwriting is restricted for a fixed period or restricted to a fixed number of times.

Figure 14:
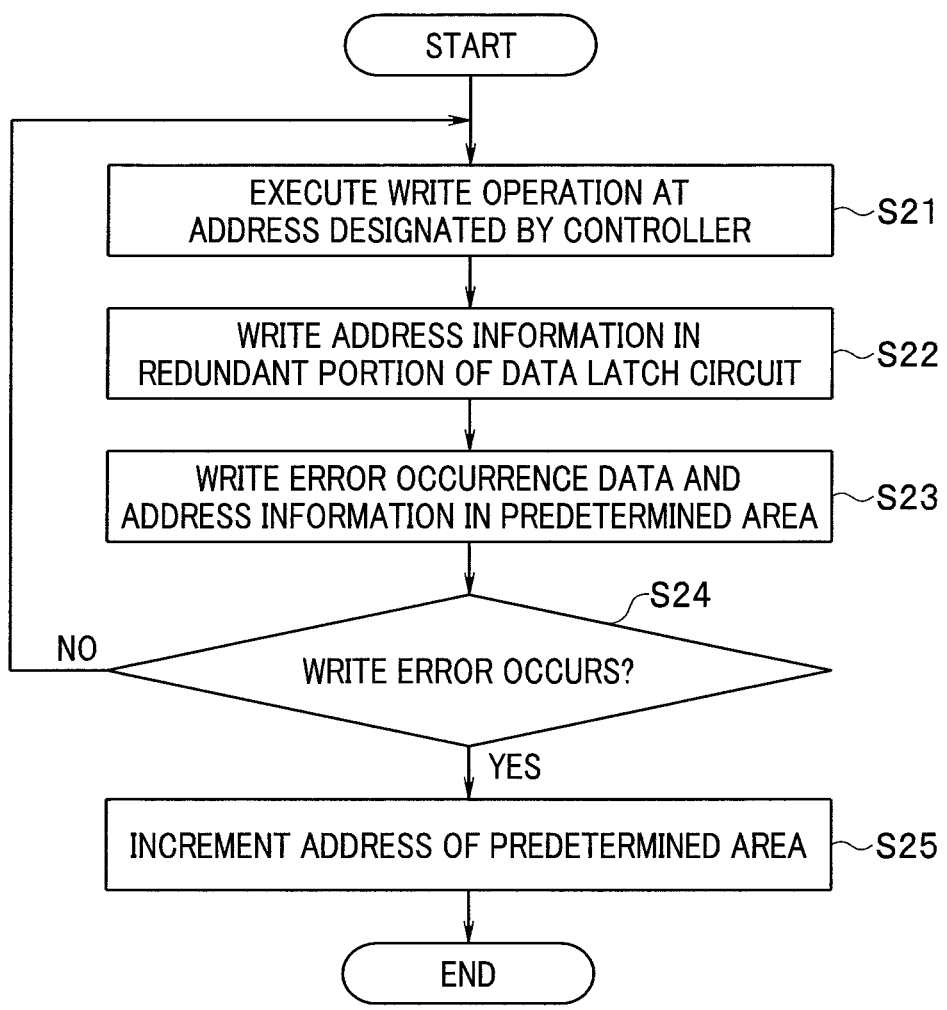
FIG. 14 is a flowchart illustrating an example of log data storage processing of a sequencer when a write error occurs, according to the modified example of the second embodiment.

FIG. 14 is a flowchart illustrating an example of log data storage processing of the sequencer 170 in a case where a write error has occurred.

The sequencer 170 executes write operation at the address designated by the controller 200 (S21).

After S21, the sequencer 170 writes the address information in the redundant portion of the data latch circuit XDL (S22).

After S22, the sequencer 170 transfers the error occurrence data and the address information to one data memory area of the predetermined memory area PMA from the data latch circuit XDL (S23).

The sequencer 170 determines whether a write error has occurred during execution of the write operation in S21 (S24). In a case where a write error occurs, the sequencer 170 increments the address of the address pointer of the predetermined memory area PMA (S25). In a case where a write error does not occur, the sequencer 170 proceeds to processing in S21.

Every time the write operation is continuously executed, if a write error does not occur (S24: NO), new data (write data) and address information are overwritten in the predetermined memory area PMA. In a case where a write error occurs (S24: YES), the sequencer 170 increments the address of the predetermined memory area PMA (S25). Thus, the log data memory area PMAp in which data (that is, the error occurrence data) and the address information are stored is not overwritten.

As described above, according to the second embodiment and the modified example described above, in a case where a write error occurs in the NAND memory 100, the log data LD is stored in the predetermined memory area PMA. The log data LD includes the error occurrence data regarding the write error and the address information (the block address BA and the page address PA). It is therefore possible to analyze a failure using the log data LD.

Note that in a case where the memory cell transistor MT is a TLC (triple level cell) which can store 3-bit data, a QLC (quad level cell) which can store 4-bit data, or the like, the predetermined memory area PMA is preferably a pSLC (pseudo single level cell) area. The pSLC area is an area in which data is written in an SLC mode. The SLC mode is a mode in which data is stored in the memory cell transistor MT such as a TLC and a QLC which can store multilevel data, in a 1-bit data format. The sequencer 170 writes data in the SLC mode in a case where the log data LD is written in the pSLC area.

For example, in a case of a TLC, as indicated with a dashed-dotted line in FIG. 2, data of three pages can be stored in a plurality of memory cell transistors MT of each word line WL. When data in an upper page is written, the data is stored in a first log data memory area of the pSLC, when data in a middle page is written, the data is stored in a second log data memory area of the pSLC, and, when data in a lower page is written, the data is stored in a third log data memory area of the pSLC.

Third Embodiment

While in the first embodiment, the log data LD is stored in a case where a read error occurs, and in the second embodiment the log data is stored in a case where a write error occurs, in the third embodiment, the log data LD regarding a use state or an operation state of the NAND memory 100 is stored in the predetermined memory area PMA in a case where some kind of error occurs.

A configuration of the memory system in the third embodiment is the same as the configuration of the memory system 1 in the first embodiment, and a configuration of the NAND memory 100 and a configuration of the memory controller 200 are also respectively the same as the configuration of the NAND memory 100 and the configuration of the memory controller 200 in the first embodiment. Thus, the same reference numerals will be used for the same components, and description will be omitted.

Figure 15:
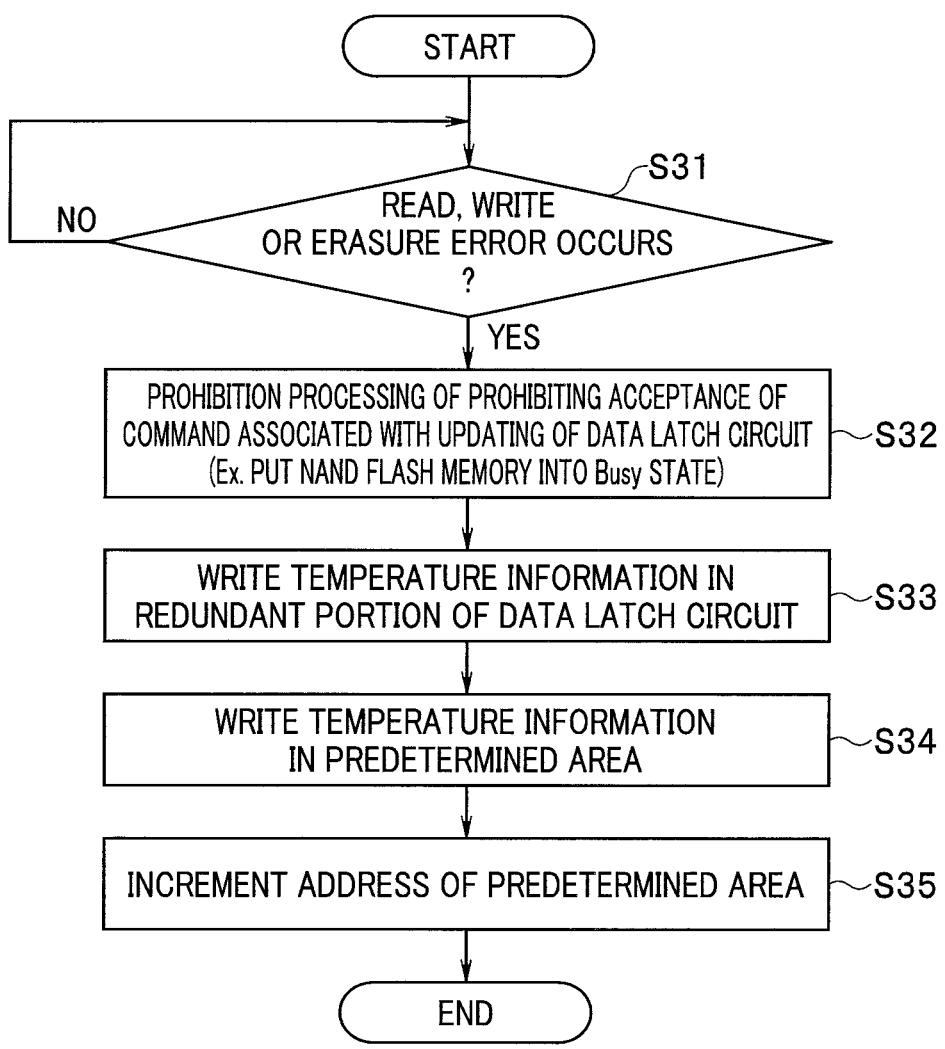
FIG. 15 is a flowchart illustrating an example of log data storage processing of a sequencer when an error occurs, according to a third embodiment.

FIG. 15 is a flowchart illustrating an example of storage processing of the log data LD by the sequencer 170 in a case where an error occurs. In the present embodiment, the log data LD includes a temperature code of the temperature sensor 190. The temperature code is acquired by the sequencer 170 and stored in a temperature code register within the register unit 180 as temperature information.

In a case where a read error occurs, the sequencer 170 receives ECC error information from the controller 200. A write error or an erasure error is detected at the sequencer 170.

The sequencer 170 determines whether some kind of error such as a read error has occurred (S31).

In a case where some kind of error is detected (S31: YES), the sequencer 170 executes processing in S32 and subsequent processing. In a case where no error is detected (S31: NO), the sequencer 170 does not execute processing in S32 and subsequent processing.

In a case where some kind of error is detected (S31: YES), the sequencer 170 prohibits acceptance of a predetermined command (P32). Here, the predetermined command is a command associated with updating of data stored in the data latch circuit XDL by the memory controller 200.

After S32, the sequencer 170 writes the temperature information of the temperature sensor 190 in the redundant portion of the data latch circuit XDL as use state data (S33).

After S33, the sequencer 170 transfers the temperature information to the predetermined memory area PMA from the data latch circuit XDL (S34). The error occurrence data and the temperature information are stored in the data latch circuit XDL. The sequencer 170 writes the data of the data latch circuit XDL in the predetermined memory area PMA.

As described above, the sequencer 170 writes the temperature information of the temperature sensor 190 in the predetermined memory area PMA.

After S34, the sequencer 170 increments the address of the address pointer of the predetermined memory area PMA (S35).

As described above, according to the third embodiment described above, in a case where some kind of error occurs in the memory system 1, the temperature information is stored in the predetermined memory area PMA as the log data LD. It is therefore possible to analyze a failure using the log data LD.

Note that while in the above-described embodiment, the log data LD including the temperature information is stored in a case where some kind of error occurs, the log data LD may include information other than the temperature information. For example, the log data LD may include information regarding the number of times of erasure or the number of times of read as operation state information of the NAND memory 100 along with the temperature information.

Further, note that the log data LD may include information regarding operation conditions such as a shift amount included in a Set Feature command as the operation state information.

In other words, the sequencer 170 may write information regarding the operation state of the NAND memory 100 in the predetermined memory area PMA.

The number of times of erasure is the number of times of execution of erase operation executed by the sequencer 170 in accordance with the received command. The number of times of erasure is counted for each block by the sequencer 170 every time an erase command is executed and is stored in an erase count register within the register unit 180.

The number of times of read is the number of times of execution of read operation executed by the sequencer 170 in accordance with the received command. The number of times of read is counted for each block by the sequencer 170 every time a read command is executed and is stored in a read count register within the register unit 180.

The information regarding the operation conditions such as a shift amount is information for setting the operation conditions to be used for executing the received command. The information regarding the operation conditions is stored in the register unit 180. For example, data regarding the operation conditions such as a shift amount regarding a Set Feature command is extracted every time the Set Feature command is received and is stored in a Feature register.

Figure 16:
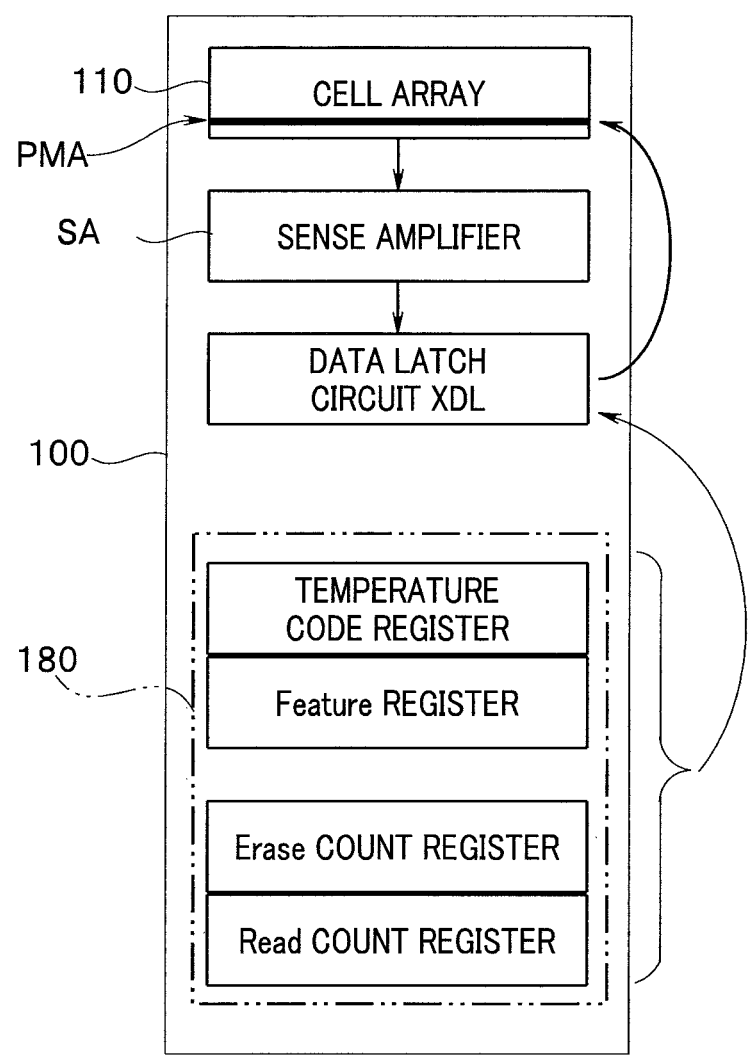
FIG. 16 is a diagram illustrating flow of storing log data in a predetermined memory area when some kind of error occurs, according to the third embodiment.

FIG. 16 is a diagram illustrating flow of storage of log data in the predetermined memory area PMA in a case where some kind of error occurs.

In a case where some kind of error occurs, the sequencer 170 writes data stored in at least one of the temperature code register, the erase count register, the read count register and the Feature register in the redundant portion of the data latch circuit XDL.

The log data LD in the data latch circuit XDL is stored in the predetermined memory area PMA within the memory cell array 110.

Note that the log data LD may also include error code information which indicates whether the occurred error is a read error, a write error or an erasure error.

As described above, according to the third embodiment described above, in a case where some kind of error occurs in the memory system 1, the sequencer 170 autonomously stores data of the use state or the operation state in the predetermined memory area PMA as the log data LD. It is therefore possible to analyze a failure using the log data LD.

Fourth Embodiment

In the third embodiment, in a case where some kind of error occurs in the memory system 1, the log data LD regarding the use state or the operation state is stored in the predetermined memory area PMA regardless of a type of the error. In the fourth embodiment, in a case where a read error occurs, log data LD including the error occurrence data, the address information (the block address BA and the page address PA), and information regarding at least one of the use state and the operation state is stored in the predetermined memory area PMA.

A configuration of the memory system in the fourth embodiment is the same as the configuration of the memory system 1 in the first embodiment, and a configuration of the NAND memory 100 and a configuration of the memory controller 200 are also respectively the same as the configuration of the NAND memory 100 and the configuration of the memory controller 200 in the first embodiment. Thus, the same reference numerals will be used for the same components, and description will be omitted.

In the first embodiment, in a case where a read error occurs, the error occurrence data and the address information (the block address BA and the page address PA) are included in the log data LD. The error occurrence data is stored in the data portion DP within the log data LD.

In contrast, in the fourth embodiment, in a case where a read error occurs, the address information (the block address BA and the page address PA) and information regarding the use state or the operation state are written in the redundant portion of the data latch circuit XDL. As a result, the address information and the information regarding the use state or the operation state such as the temperature information are included in the redundant portion RP within the log data LD.

In other words, a command to be received by the sequencer 170 is a read command from the memory controller 200 which controls the NAND memory 100. The sequencer 170 reads data from the NAND memory 100 in accordance with the read command. The sequencer 170 outputs the read data to the memory controller 200 as read data. When the sequencer 170 receives a notification of a read error from the memory controller 200, the sequencer 170 writes predetermined data in the predetermined memory area PMA. The predetermined data includes the read data, address information regarding the read command, and information regarding the use state or the operation state of the NAND memory 100.

As described above, according to the fourth embodiment described above, in a case where a read error occurs in the memory system 1, the sequencer 170 autonomously stores the log data LD in the predetermined memory area PMA of the NAND memory 100. The log data LD includes the error occurrence data regarding the read error, the address information (the block address BA and the page address PA), and the information regarding the use state or the operation state. It is therefore possible to analyze a failure using the log data LD within the NAND memory 100.

Fifth Embodiment

In the third embodiment, in a case where some kind of error occurs in the memory system 1, the log data LD regarding the use state or the operation state is stored in the predetermined memory area PMA regardless of a type of the error. In the present fifth embodiment, in a case where a write error occurs, log data LD including the error occurrence data, the address information (the block address BA and the page address PA) and information regarding at least one of the use state and the operation state is stored in the predetermined memory area PMA.

A configuration of the memory system in the fifth embodiment is the same as the configuration of the memory system 1 in the first embodiment, and a configuration of the NAND memory 100 and a configuration of the memory controller 200 are also respectively the same as the configuration of the NAND memory 100 and the configuration of the memory controller 200 in the first embodiment. Thus, the same reference numerals will be used for the same components, and description will be omitted.

In the second embodiment, in a case where a write error occurs, the error occurrence data and the address information are included in the log data LD. The error occurrence data is stored in the data portion DP within the log data LD.

In contrast, in the fifth embodiment, in a case where a write error occurs, the address information (the block address BA and the page address PA) and the information regarding the use state or the operation state are written in the redundant portion of the data latch circuit XDL. As a result, the address information and the information regarding the use state or the operation state such as the temperature information are included in the redundant portion RP within the log data LD.

As described above, according to the fifth embodiment described above, in a case where a write error occurs in the memory system 1, the sequencer 170 autonomously stores the log data LD in the predetermined memory area PMA of the NAND memory 100. The log data LD includes the error occurrence data regarding the write error, the address information (the block address BA and the page address PA), and the information regarding the use state or the operation state. It is therefore possible to analyze a failure using the log data LD within the NAND memory 100.

In other words, the command to be received by the sequencer 170 is a write command from the memory controller 200 which controls the NAND memory 100. The sequencer 170 writes data in the NAND memory 100 in accordance with the write command. In a case where a data write error occurs, the sequencer 170 writes predetermined data in the predetermined memory area PMA. The predetermined data includes write data, address information regarding the write command, and information regarding the use state or the operation state of the NAND memory 100.

Note that the modified example of the second embodiment can be also applied to the present fifth embodiment. In other words, the log data LD including the error occurrence data, the address information and the information regarding at least one of the use state and the operation state may be stored in the predetermined memory area PMA every time data is written, and in a case where a write error occurs, updating of data in the predetermined memory area PMA may be prohibited.

As described above, according to the above-described respective embodiments, the sequencer 170 can receive a command from the memory controller 200 which controls data read operation and data write operation with respect to the NAND memory 100. The sequencer 170 writes predetermined data in the predetermined memory area PMA of the NAND memory 100 in a case where an error occurs in operation (read operation, write operation, erase operation) in accordance with the received command.

Thus, according to the above-described respective embodiments, it is possible to provide a semiconductor storage device which is capable of storing data for analyzing a failure.

The above-described embodiments and modified example may be combined with each other in a possible range. For example, the modified example of the second embodiment can be combined with the third embodiment.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array including a plurality of blocks and configured to be able to store first data;
   a sequencer configured to control a sequence based on read operation of reading the first data from the memory cell array on a basis of a read command received from a memory controller; and
   a column decoder comprising a sense amplifier configured to perform sense operation necessary for reading the first data from the memory cell array, and a data latch circuit configured to store the first data,
   at least one block among the plurality of blocks comprising first and second select transistors and a plurality of non-volatile memory cells connected in series between the first and second select transistors,
   the sequencer controlling the sequence of:
   receiving the read command and an address signal;
   changing a ready/busy signal from ready to busy after receiving the read command and the address signal;
   reading the first data from the memory cell array using the sense amplifier after changing the ready/busy signal to the busy, and storing the first data in the data latch circuit;
   changing the ready/busy signal from the busy to the ready after storing the first data in the data latch circuit;
   receiving a data output command after changing the ready/busy signal to the ready;
   outputting the first data stored in the data latch circuit to the memory controller after receiving the data output command; and
   in a case of reception of a notification of a read error, writing log data including the first data stored in the data latch circuit in a memory area of the memory cell array,
   the data latch circuit being configured to store the first data and the address signal.

2. The semiconductor storage device according to claim 1,
   wherein when the sequencer receives the read command and the address signal,
   the sequencer controls the sequence of:
   receiving a command latch enable signal and the read command; and
   receiving an address latch enable signal and the address signal after receiving the read command.

3. The semiconductor storage device according to claim 1, wherein
the sequencer controls the sequence of:
prohibiting data update of the data latch circuit in a case where the notification of the read error is received from the memory controller; and
writing the log data in the memory area after the data update is prohibited.

4. The semiconductor storage device according to claim 3, wherein the sequencer controls the sequence of restricting writing in a first area after writing the log data in the first area of the memory area.

5. The semiconductor storage device according to claim 1, wherein
the sequencer controls the sequence of:
managing an address pointer for controlling an address in the memory area at which the log data is to be written;
writing the log data in a first area of the memory area on a basis of the address pointer in a case where the notification of the read error is received from the memory controller;
changing a value of the address pointer after writing the log data in the first area; and
in a case where the notification of the read error is received again from the memory controller, writing the log data in a second area of the memory area on a basis of the changed address pointer.

6. The semiconductor storage device according to claim 1, further comprising:
a temperature sensor; and
a register configured to store temperature information acquired using the temperature sensor,
wherein the log data includes the temperature information stored in the register.

7. The semiconductor storage device according to claim 1, wherein the log data further includes information regarding an operation state of the semiconductor storage device, and
the information regarding the operation state includes at least one of information regarding a number of times of execution of read operation executed by the sequencer, information regarding a number of times of execution of erase operation executed by the sequencer, and information regarding a condition used in operation executed by the sequencer.

8. A semiconductor storage device comprising:
a memory cell array including a plurality of blocks and configured to be able to store first data;
a sequencer configured to control a sequence based on write operation of writing the first data in the memory cell array on a basis of a write command received from a memory controller; and
a column decoder comprising a sense amplifier configured to perform operation necessary for writing the first data in the memory cell array, and a data latch circuit configured to store the first data,
at least one block among the plurality of blocks comprising first and second select transistors, and a plurality of non-volatile memory cells connected in series between the first and second select transistors,
the sequencer controlling the sequence of:
receiving the write command, an address signal, and the first data;
changing a ready/busy signal from ready to busy after receiving the write command, the address signal, and the first data;
storing the received first data in the data latch circuit;
writing the first data stored in the data latch circuit in the memory cell array using the sense amplifier after changing the ready/busy signal from the ready to the busy;
changing the ready/busy signal from the busy to the ready after writing the first data in the memory cell array; and
in a case of occurrence of a write error, writing log data including the first data stored in the data latch circuit in a memory area of the memory cell array,
the data latch circuit being configured to store the first data and the address signal.

9. The semiconductor storage device according to claim 8, wherein when the sequencer receives the write command, the address signal, and the first data,
the sequencer controls the sequence of:
receiving a command latch enable signal and the write command; and
receiving an address latch enable signal and the address signal after receiving the write command.

10. The semiconductor storage device according to claim 8, wherein
the sequencer controls the sequence of:
in a case where the write error occurs; prohibiting data update of the data latch circuit; and
writing the log data in the memory area after prohibiting the data update.

11. The semiconductor storage device according to claim 10,
wherein the sequencer controls the sequence of restricting writing in a first area after writing the log data in the first area of the memory area.

12. The semiconductor storage device according to claim 8,
wherein
the sequencer controls the sequence of:
managing an address pointer for controlling an address in the memory area at which the log data is to be written;
in a case where the write error occurs, writing the log data in a first area of the memory area on a basis of the address pointer;
changing a value of the address pointer after writing the log data in the first area; and
in a case where the write error occurs again, writing the log data in a second area of the memory area on a basis of the changed address pointer.

13. The semiconductor storage device according to claim 8, further comprising:
a temperature sensor; and
a register configured to store temperature information acquired using the temperature sensor,
wherein the log data includes the temperature information stored in the register.

14. The semiconductor storage device according to claim 8,
wherein the log data further includes information regarding an operation state of the semiconductor storage device, and
the information regarding the operation state includes at least one of information regarding a number of times of execution of read operation executed by the sequencer, information regarding a number of times of execution of erase operation executed by the sequencer, and information regarding a condition used for operation executed by the sequencer.

15. A semiconductor storage device comprising:

a memory cell array including a plurality of blocks and configured to be able to store first data;

a sequencer configured to control a sequence based on write operation of writing the first data in the memory cell array on a basis of a write command received from a memory controller; and a column decoder comprising a sense amplifier configured to perform operation necessary for writing the first data in the memory cell array, and a data latch circuit configured to store the first data, at least one block among the plurality of blocks comprising first and second select transistors, and a plurality of non-volatile memory cells connected in series between the first and second select transistors, the sequencer controlling the sequence of:

managing an address pointer for controlling an address of a memory area of the memory cell array;

receiving the write command, an address signal, and the first data;

changing a ready/busy signal from ready to busy after receiving the write command, the address signal; and the first data;

storing the received first data in the data latch circuit;

writing the first data stored in the data latch circuit in the memory cell array using the sense amplifier after changing the ready/busy signal to the busy;

writing log data including the first data stored in the data latch circuit in the memory area on a basis of the address pointer after writing the first data in the memory cell array;

changing the ready/busy signal from the busy to the ready after writing the log data in the memory area; and in a case of occurrence of a write error, changing a value of the address pointer, the data latch circuit being configured to store the first data and the address signal.

16. The semiconductor storage device according to claim 15, further comprising:

a temperature sensor; and a register configured to store temperature information acquired using the temperature sensor, wherein the log data includes the temperature information stored in the register.

17. The semiconductor storage device according to claim 15, wherein the log data further includes information regarding an operation state of the semiconductor storage device, and the information regarding the operation state includes at least one of information regarding a number of times of execution of read operation executed by the sequencer, information regarding a number of times of execution of erase operation executed by the sequencer, and a condition used for operation executed by the sequencer.

* * * * *